United States Patent
Baba-Ali

(10) Patent No.: US 7,286,137 B2
(45) Date of Patent: Oct. 23, 2007

(54) METHOD AND SYSTEM FOR CONSTRAINED PIXEL GRAYTONES INTERPOLATION FOR PATTERN RASTERIZATION

(75) Inventor: Nabila Baba-Ali, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 271 days.

(21) Appl. No.: 11/066,264

(22) Filed: Feb. 28, 2005

(65) Prior Publication Data

US 2006/0192789 A1    Aug. 31, 2006

(51) Int. Cl.
G09G 5/00 (2006.01)
G09G 5/02 (2006.01)
G06K 9/32 (2006.01)
G03F 3/08 (2006.01)

(52) U.S. Cl. ............... 345/606; 345/426; 345/581; 345/586; 382/254; 382/300; 358/518

(58) Field of Classification Search ......... 345/426, 345/428, 581, 586, 589, 592, 596, 606, 610, 345/616, 626, 640, 690, 643–644, 204, 22, 345/48, 56, 61, 63, 84; 382/254, 274, 276, 382/300, 162, 167; 358/518, 525; 430/5, 430/7, 43; 359/237, 242–246, 271, 277
See application file for complete search history.

(56) References Cited

U.S. PATENT DOCUMENTS

| | | |
|---|---|---|
| 5,229,872 A | 7/1993 | Mumola |
| 5,296,891 A | 3/1994 | Vogt et al. |
| 5,500,736 A | 3/1996 | Koitabashi et al. |
| 5,523,193 A | 6/1996 | Nelson |
| 5,530,482 A | 6/1996 | Gove et al. |
| 5,579,147 A | 11/1996 | Mori et al. |
| 5,677,703 A | 10/1997 | Bhuva et al. |
| 5,808,797 A | 9/1998 | Bloom et al. |
| 5,982,553 A | 11/1999 | Bloom et al. |
| 6,133,986 A | 10/2000 | Johnson |
| 6,177,980 B1 | 1/2001 | Johnson |
| 6,687,041 B1 | 2/2004 | Sandstrom |
| 6,747,783 B1 | 6/2004 | Sandstrom |
| 6,795,169 B2 | 9/2004 | Tanaka et al. |

(Continued)

FOREIGN PATENT DOCUMENTS

WO      WO 98/33096      7/1998

(Continued)

Primary Examiner—Wesner Sajous
(74) Attorney, Agent, or Firm—Sterne, Kessler, Goldstein & Fox P.L.L.C.

(57) ABSTRACT

A method and system for preparing data to be used by a patterning device. The method including the following steps: a first set of graytones for a set of pixels is calculated, the first set of graytones corresponding to a center of a pattern being located at a first grid position, and a second set of graytones for the set of pixels is calculated, the second set of graytones corresponding to the center of the pattern being located at a second grid position. A plurality of sets of graytones for the set of pixels is linearly interpolated with constraints, from the first and second set of graytones, the plurality of sets of graytones corresponding to the pattern being shifted by a continuous shift-amount between the first grid position and the second grid position.

18 Claims, 8 Drawing Sheets

U.S. PATENT DOCUMENTS

| | | |
|---|---|---|
| 6,806,897 B2 | 10/2004 | Kataoka et al. |
| 6,811,953 B2 | 11/2004 | Hatada et al. |
| 2004/0041104 A1 | 3/2004 | Liebregts et al. |
| 2004/0130561 A1 | 7/2004 | Jain |
| 2005/0007572 A1 | 1/2005 | George et al. |
| 2005/0243398 A1* | 11/2005 | Latypov ..................... 359/237 |
| 2005/0260508 A1* | 11/2005 | Lizotte ........................... 430/5 |
| 2006/0109576 A1* | 5/2006 | Baba-Ali .................... 359/879 |
| 2006/0192789 A1* | 8/2006 | Baba-Ali .................... 345/606 |

FOREIGN PATENT DOCUMENTS

| | | |
|---|---|---|
| WO | WO 98/38597 | 9/1998 |

* cited by examiner

METHOD AND SYSTEM FOR CONSTRAINED PIXEL GRAYTONES INTERPOLATION FOR PATTERN RASTERIZATION

BACKGROUND OF THE INVENTION

1. Field of the Invention

The present invention relates to patterning devices. In particular, the present invention is directed to a method and system for preparing data to be used by a patterning device.

2. Background Art

A patterning device is used to pattern incoming light. A static patterning device can include reticles, also referred to as masks. A dynamic patterning device can include an array of individually controllable elements that generate a pattern through receipt of analog or digital signals. The algorithm used to control the dynamic patterning device, so that its individually controllable elements are in a proper state to form a desired pattern, is called a rasterization algorithm or optical rasterization algorithm. Example environments for use of the patterning device can be, but are not limited to, a lithographic apparatus, an optical maskless lithography (OML) apparatus, a projector, a projection display apparatus, or the like.

Current optical rasterization algorithms can require significant memory and/or CPU-time from a patterning apparatus. For example, optical rasterization algorithms used in OML require the manipulation of mask vector data at multiple grid positions in the array of individually controllable elements to ensure accurate printing of a mask pattern regardless of where the pattern edges lie with respect to the array grid. If the data manipulation is done off-line, the results need to be stored, which can require significant memory. If, on the other hand, the data manipulation is done in-line, significant CPU time is required.

Therefore, what is needed is an improved optical rasterization algorithm that reduces the amount of memory and/or CPU-time required from the patterning apparatus. In addition, the improved optical rasterization algorithm should be able to correct for a variety of distortion errors.

BRIEF SUMMARY OF THE INVENTION

The present invention is directed to an improved rasterization method and a system that implements the improved rasterization method. The improved rasterization algorithm reduces the amount of memory and/or CPU-time required from a patterning apparatus. In addition, the improved rasterization algorithm can be used to correct for a variety of distortion errors, while extensions of the improved rasterization algorithm can be used to correct for more complex distortions, as will become apparent to one skilled in the relevant art upon reading the description contained herein.

An embodiment of the present invention provides a rasterization method, including the following steps. A first set of graytones is calculated for a set of pixels, the first set of graytones corresponding to a center of a pattern being located at a first grid position. A second set of graytones is calculated for the set of pixels, the second set of graytones corresponding to the center of the pattern being located at a second grid position. A plurality of sets of graytones for the set of pixels is linearly interpolated with constraints, from the first and second set of graytones, the plurality of sets of graytones corresponding to the pattern being shifted by a continuous shift-amount between the first grid position and the second grid position.

In an example, the constraints include the following: setting a slope of each respective pixel in the set of pixels equal to either zero or alpha, wherein alpha is equal to (1−Att)/Wp, with Att being a maximum negative graytone amplitude and Wp being a width of each pixel in the set of pixels as projected on a target.

In a further example, the constraints include: determining a first range of the shift-amounts and a second range of the shift-amounts for each respective pixel based on the first graytone of the respective pixel, alpha, and the second graytone in the second set of graytones corresponding to the respective pixel.

In a still further example, the constraints further include the following. The slope of each respective pixel in the set of pixels is set equal to zero over a first range of the shift-amounts and alpha over a second range of the shift-amounts, if at least one of the following is true: (i) a first graytone in the first set of graytones corresponding to the respective pixel is equal to one and a second graytone in the second set of graytones corresponding to the respective pixel is greater than (1−Att)/2; and (ii) the first graytone in the first set of graytones corresponding to the respective pixel is equal to Att and the second graytone in the second set of graytones corresponding to the respective pixel is less than (1−Att)/2.

In yet a further example, the constraints further include the following. The slope of each respective pixel in the set of pixels is set equal to alpha over the first range of the shift-amounts and zero over the second range of the shift-amounts, if at least one of the following is true: (i) the first graytone in the first set of graytones corresponding to the respective pixel is equal to one and the second graytone in the second set of graytones corresponding to the respective pixel is less than (1−Att)/2; (ii) the first graytone in the first set of graytones corresponding to the respective pixel is equal to Att and the second graytone in the second set of graytones corresponding to the respective pixel is greater than (1−Att)/2; and (iii) the first graytone in the first set of graytones corresponding to the respective pixel is different than one of one and Att.

Another embodiment of the present invention provides a system, including a computing module and an interpolator. The computing module computes a first and second set of graytones for a set of pixels. The first set of graytones corresponds to a center of a pattern being located at a first grid position. The second set of graytones corresponds to the center of the pattern being located at a second grid position. The interpolator linearly interpolates with constraints, from the first and second set of graytones, a plurality of sets of graytones for the set of pixels. The plurality of sets of graytones correspond to the pattern being shifted by a continuous shift-amount between the first grid position and the second grid position.

In an example, the interpolator linearly interpolates with constraints a plurality of sets of graytones for the set of pixels. The constraints include setting a slope for the graytone of each respective pixel in the set of pixels equal to one of zero and alpha, wherein alpha is equal to (1−Att)/Wp, with Att being a maximum negative amplitude and Wp being a width of each pixel in the set of pixels as projected on a target.

In a further example, the interpolator determines a first range of the shift-amounts and a second range of the shift-amounts for each respective pixel, based on the first graytone of the respective pixel, alpha, and the second graytone in the second set of graytones corresponding to the respective pixel.

In a still further example, the interpolator linearly interpolates with constraints a plurality of sets of graytones for the set of pixels. The constraints further include the following. The slope of each respective pixel in the set of pixels is set equal to zero over a first range of the shift-amounts and alpha over a second range of the shift-amounts, if at least one of the following is true: (i) a first graytone in the first set of graytones corresponding to the respective pixel is equal to one and a second graytone in the second set of graytones corresponding to the respective pixel is greater than (1−Att)/2; and (ii) the first graytone in the first set of graytones corresponding to the respective pixel is equal to Att and the second graytone in the second set of graytones corresponding to the respective pixel is less than (1−Att)/2.

In yet a further example, the interpolator linearly interpolates with constraints a plurality of sets of graytones for the set of pixels. The constraints further include the following. The slope of each respective pixel in the set of pixels is set equal to alpha over the first range of the shift-amounts and zero over the second range of the shift-amounts, if at least one of the following is true: (i) the first graytone in the first set of graytones corresponding to the respective pixel is equal to one and the second graytone in the second set of graytones corresponding to the respective pixel is less than (1−Att)/2; (ii) the first graytone in the first set of graytones corresponding to the respective pixel is equal to Att and the second graytone in the second set of graytones corresponding to the respective pixel is greater than (1−Att)/2; and (iii) the first graytone in the first set of graytones corresponding to the respective pixel is different than one of one and Att.

Further embodiments, features, and advantages of the present invention, as well as the structure and operation of the various embodiments of the present invention, are described in detail below with reference to the accompanying drawings.

It is to be appreciated that the Summary represents one or more exemplary embodiments and/or examples, but not all embodiments and/or examples of the present invention, and thus should not be seen to be limiting the present invention, or the appended claims, in any way.

BRIEF DESCRIPTION OF THE DRAWINGS/FIGURES

The accompanying drawings, that are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements.

DETAILED DESCRIPTION OF THE INVENTION

Figure 1:
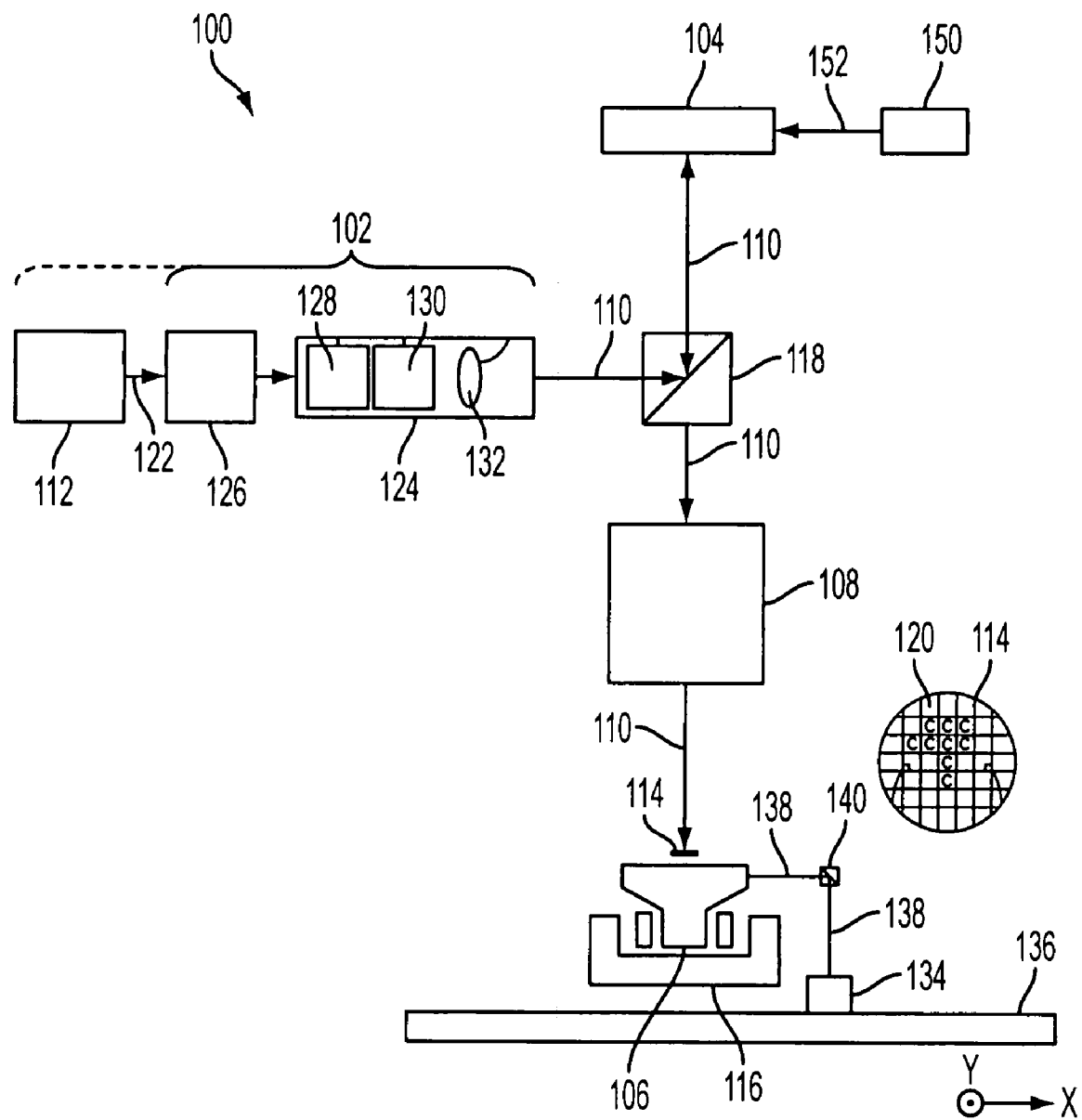
FIG. 1 is a block diagram of an exemplary lithographic apparatus, in accordance with an embodiment of the present invention.

I. Introduction and Guide to the Detailed Description

Although specific reference can be made in this text to the use of a lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc.

The present invention is directed to a method and system for preparing data to be used by a patterning device. As is described herein, the method and system reduce the amount of memory and/or CPU-time during the preparation of the data as compared to conventional rasterization algorithms and systems.

As mentioned above, patterning devices can be couched in many environments, including, but not limited to, a lithographic apparatus, an optical maskless lithography (OML) apparatus, a projector, a projection display apparatus, or the like. For definiteness, the present invention is described in the context of an OML apparatus. Accordingly, subsection II describes terminology used in this disclosure and subsection III describes an exemplary lithographic apparatus. It is to be appreciated that these two subsections do not necessarily describe the novelty of the present invention; however, upon reading and understanding the description contained therein, the skilled artisan will be able to practice the present invention in a lithographic environment and other environments that utilize patterning devices.

The specific implementation of optical rasterization algorithms may vary. Accordingly, subsection IV describes an overview of a typical approach to optical rasterization methods, which involves a process called "supersampling." Subsection V describes three different ways to determine states, or graytones, of pixels, including a method (hereinafter referred to as "linear interpolation with constraints"), in accordance with an embodiment of the present invention.

Subsection VI describes the constraints of an exemplary rasterization method of the present invention, and in subsection VII, the rasterization method is summarized. As mentioned above, and as described in more detail herein, the rasterization method can be implemented in an optical maskless lithography apparatus.

II. Terminology

The use of the terms "wafer" or "die" herein can be considered as synonymous with the more general terms "substrate" or "target portion", respectively. The substrate referred to herein can be processed, before or after exposure, in, for example, a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multilayer IC, so that the term substrate used herein can also refer to a substrate that already contains multiple processed layers.

The terms "radiation" and "beam" used herein encompass all types of electromagnetic radiation, including ultraviolet (UV) radiation (e.g., having a wavelength of 365, 355, 248, 193, 157 or 126 nm) and extreme ultraviolet (EUV) radiation (e.g., having a wavelength in the range of 5-20 nm), as well as particle beams, such as ion beams or electron beams.

The term "array of individually controllable elements" as here employed should be broadly interpreted as referring to any device that can be used to endow an incoming radiation beam with a patterned cross-section, so that a desired pattern can be created in a target portion of the substrate. The terms "light valve," "Spatial Light Modulator" (SLM), and "contrast device" can also be used in this context. Examples of such patterning devices are discussed below.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

III. An Exemplary Lithographic Apparatus

FIG. 1 is a block diagram of a lithographic projection apparatus 100. Apparatus 100 includes a radiation system 102, a pattern generator 104, a projection system 108 ("lens"), and an object table 106 (e.g., a substrate table). An overview of the operation of lithographic apparatus 100 follows. Then alternative embodiments of lithographic apparatus 100 are discussed. After the overview and alternative embodiments of lithographic apparatus 100, details and alternative embodiments of each of the elements in apparatus 100 are described.

A. Overview and Alternative Embodiments

Radiation system 102 can be used for supplying a beam 110 of radiation (e.g., UV radiation). In this particular case, radiation system 102 also comprises a radiation source 112. Beam 110 subsequently intercepts the pattern generator 104 after being directed using beam splitter 118. Pattern generator 104 (e.g., a programmable mirror array) can be used for applying a pattern to beam 110. Having been reflected by pattern generator 104, beam 110 passes through projection system 108, which focuses beam 110 onto a target portion 120 of the substrate 114.

As shown in FIG. 1, pattern generator 104 is a reflective device; however, in alternative embodiments a pattern generator used in a lithography apparatus can be a transmissive device. It is to be appreciated that both reflective and transmissive devices can be used to practice the present invention.

In an alternative embodiment (not shown), lithographic apparatus 100 can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

Lithographic apparatus 100 can also be of a type wherein the substrate is immersed in a liquid (not shown) having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, lithographic apparatus 100 can be provided with a fluid processing cell to allow interactions between a fluid and irradiated parts of the substrate (e.g., to selectively attach chemicals to the substrate or to selectively modify the surface structure of the substrate).

Although lithography apparatus 100 according to an embodiment of the present invention is herein described as being for exposing a resist on a substrate, it will be appreciated that the invention is not limited to this use and apparatus 100 can be used to project a patterned beam 110 for use in resistless lithography.

B. Radiation System

In the example of FIG. 1, radiation system 102 can include a source 112, a conditioning device 126, and an illumination source (illuminator) 124. In addition, illuminator 124 will generally include various other components, such as an integrator 130 and a condenser 132.

Source 112 (e.g., an excimer laser) can produce a beam of radiation 122. Beam 122 is fed into illumination source (illuminator) 124, either directly or after having traversed conditioning device 126, such as a beam expander, for example. Adjusting device 128 can be used for setting the outer and/or inner radial extent (commonly referred to as σ-outer and σ-inner, respectively) of the intensity distribution in beam 122. In this way, beam 110 impinging on the pattern generator 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

The illumination source can also encompass various types of optical components, including refractive, reflective, and catadioptric optical components for directing, shaping, or controlling the beam of radiation, and such components can also be referred to below, collectively or singularly, as a "lens."

C. Pattern Generator

Pattern generator 104 includes SLMs that can be regarded as replacing a conventional reticle. The states of the SLM pixels can be varied to emulate a conventional reticle. Example SLM pixel states are ON, OFF, or in an intermediate state between ON and OFF (hereinafter referred to as a "graytone"). In an ON state, an SLM pixel reflects (transmits) a maximum amplitude of radiation. In an OFF state, an SLM pixel reflects (transmits) no radiation. A graytone of an SLM pixel reflects (transmits) an amplitude of radiation that is less than the ON state, but greater than the OFF state.

In addition, a graytone of an SLM pixel can be considered to have a negative amplitude. A negative amplitude of an SLM pixel graytone means that the radiation reflected (transmitted) by the SLM pixel is 180 degrees out-of-phase with radiation that is reflected (transmitted) by other SLM pixels in pattern generator 104.

In various examples, the SLM pixels can be used to emulate binary masks, alternating phase-shift masks (Alt PSMs), and attenuating phase-shift masks (Att PSMs). To emulate a binary mask the SLM pixels are either ON (1) or OFF (0), in a binary fashion. PSMs have transmissive areas that are in or out of phase with respect to each other. In an Alt PSM the pixels states are either ON or OFF; whereas, in Att PSM the pixels can be in an ON state, an OFF state, or an intermediate (attenuated) state.

Pattern generator 104 optionally includes driving electronics for the SLM pixels, and a data path. Input image data is transformed into a suitable format and fed to the SLM by controller 150 (described in more detail below), via the data path. The drive electronics addresses each SLM pixel in sequence as the SLM pattern is updated, i.e., each new SLM image frame can be loaded by normal matrix addressing. The frame rate, i.e., the time required to load each new frame onto the SLM, is a determining factor on apparatus throughput.

Current technology may not allow construction of a single SLM that can provide the massive array of pixels necessary to give the throughput required in many applications. Thus, typically a multiple SLM array (MSA) is used in parallel to provide the number of pixels needed. For example, the pixels from different SLMs of the MSA are "stitched" together to form a cohesive image on the substrate. This can be done using motion control and gray scaling techniques. In the following description, for most instances, a reference to an SLM can also be interpreted as including an MSA.

In general, the position of pattern generator 104 can be fixed relative to projection system 108. However, in an alternative arrangement, pattern generator 104 can be connected to a positioning device (not shown) for accurately positioning it with respect to projection system 108. As depicted in FIG. 1, pattern generator 104 is of a reflective type, e.g., a programmable mirror array. Examples of other types of pattern generators can include, but are not limited to, tilting mirrors, phase-tilting mirrors, pistoning mirrors, grating light valves, tilting reflective devices, pistoning reflective devices, graytoning transmissive devices and graytoning reflective devices.

It will be appreciated that, as an alternative, a filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means.

In the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example LCD array is described in U.S. Pat. No. 5,229,872, which is incorporated herein by reference in its entirety.

D. Controller

A controller 150 supplies data to pattern generator 104 to control the actuation state of the individual SLMs of pattern generator 104. Controller 150 includes a data path 152. Controller 150 optionally includes one or more frame buffers (not shown) and other conventional components (not shown) necessary for matrix addressing of the SLM each time a new SLM frame is loaded. Based on the description herein, appropriate image digitization and SLM drive electronics will become apparent to one of ordinary skill in the art. For instance, controller 150 can be similar to a bit map based mask-writer, but with appropriate matrix addressing drive circuitry for addressing individual SLM pixels of the particular type of SLM used.

Figure 2:
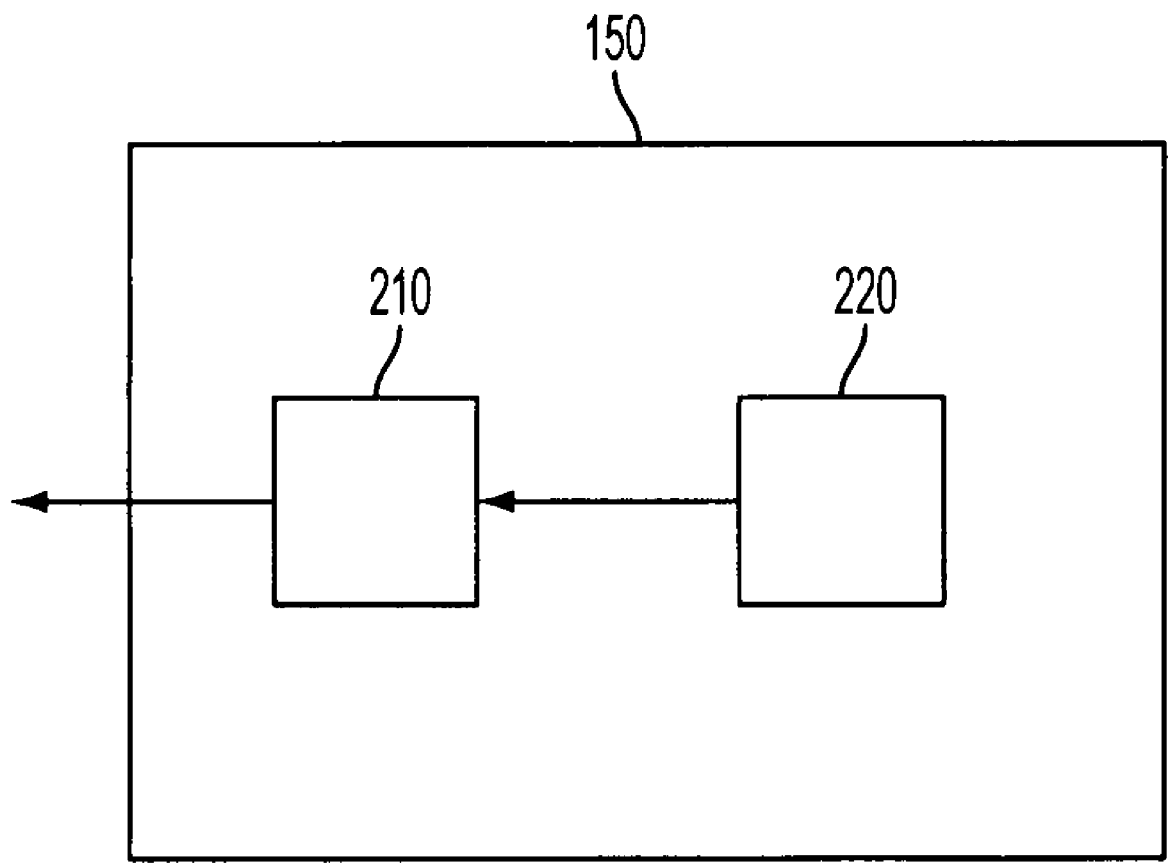
FIG. 2 is a block diagram of an exemplary controller, in accordance with an embodiment of the present invention.

In an example embodiment, controller 150 includes hardware, software, firmware, or combinations thereof, (collectively referred to herein as "modules") configured to performed functions in accordance with the present invention. FIG. 2 is a block diagram of an example embodiment of controller 150, which includes a computing module 220 and an interpolator 210.

As mentioned above, and as described in more detail below, the graytones of the SLM pixels of pattern generator 104 are determined to render the desired pattern. The pattern must be printable regardless of where the pattern edges lie with respect to the SLM pixels. Hence, in traditional rasterization methods, if the pattern is shifted in relation to the SLM pixels (a so called "shift error"), an entirely new set of graytones of the SLM pixels must be computed to render the shifted image, which can require significant memory and/or CPU-time.

However, in accordance with the present invention, computing module 220 and interpolator 210 are configured to correct shift errors while using less memory and/or CPU-time as compared to conventional rasterization methods. Computing module 220 computes a first and second set of graytones for a set of pixels. The first and second set of graytones correspond to a center of a pattern being located at a first and second grid position, respectively. Interpolator 210 linearly interpolates with constraints, from the first and second set of graytones, a plurality of sets of graytones for the set of pixels. The plurality of sets of graytones correspond to the pattern being shifted by a continuous shift-amount between the first grid position and the second grid position. Since interpolator 210 interpolates the pixel graytones for the shifted pattern from the first and second set of graytones, the computation of the pixel graytones for the shifted pattern requires less memory and/or CPU-time than a traditional rasterization method. Interpolator 210 provides the first set of graytones, the second set of graytones, and the plurality of sets of graytones to pattern generator 104 via datapath 152.

(The above description is to serve as a preview of the computation of the graytones and the interpolation method of the present invention. A more thorough description of these methods can be found in subsections IV through VII below.)

E. Projection System

Projection system 108 (e.g., a quartz and/or $CaF_2$ lens system or a catadioptric system comprising lens elements made from such materials, or a mirror system) can be used for projecting the patterned beam received from beam splitter 118 onto a target portion 120 (e.g., one or more dies) of substrate 114. Projection system 108 can project an image of the pattern generator 104 onto substrate 114. Alternatively, projection system 108 can project images of secondary sources so that the elements of the pattern generator 104 act as shutters. Projection system 108 can also include a micro lens array (MLA) to form the secondary sources and to project microspots onto substrate 114.

F. Object Table

Object table 106 can be provided with a substrate holder (not specifically shown) for holding a substrate 114 (e.g., a resist coated silicon wafer, a projection system display or a projection television display device). In addition, object table 106 can be connected to a positioning device 116 for accurately positioning substrate 114 with respect to projection system 108.

With the aid of positioning device 116 (and optionally interferometric measuring device 134 on a base plate 136 that receives interferometric beams 138 via beam splitter 140), object table 106 can be moved accurately, so as to position different target portions 120 in the path of beam 110. Where used, the positioning device for the pattern generator 104 can be used to accurately correct the position of the pattern generator 104 with respect to the path of beam 110. In general, movement of object table 106 is realized with the aid of a long-stroke module (course positioning) and a short-stroke module (fine positioning), that are not explicitly depicted in FIG. 1. A similar system can also be used to position pattern generator 104. It will be appreciated that beam 110 can alternatively and/or additionally be moveable, while object table 106 and/or the pattern generator 104 can have a fixed position to provide the required relative movement.

In an alternative configuration, object table 106 can be fixed, with substrate 114 being moveable over object table 106. Where this is done, object table 106 is provided with a multitude of openings on a flat uppermost surface, gas being fed through the openings to provide a gas cushion that is capable of supporting substrate 114. This is conventionally referred to as an air bearing arrangement. Substrate 114 is moved over object table 106 using one or more actuators (not shown), that are capable of accurately positioning substrate 114 with respect to the path of beam 110. Alternatively, substrate 114 can be moved over object table 106 by selectively starting and stopping the passage of gas through the openings.

It should be appreciated that where pre-biasing of features, optical proximity correction features, phase variation techniques and multiple exposure techniques are used, for example, the pattern "displayed" on pattern generator 104 can differ substantially from the pattern eventually transferred to a layer of or on the substrate. Similarly, the pattern eventually generated on the substrate does not necessarily correspond to the pattern formed at any one instant on pattern generator 104. This can be the case in an arrangement in which the eventual pattern formed on each part of the substrate is built up over a given period of time or a given number of exposures during which the pattern on pattern generator 104 and/or the relative position of the substrate changes.

In an example, substrate 114 can include, but is not limited to, a semiconductor wafer, a flat panel display glass substrate, or a display of a projection device.

G. Exemplary Modes of Operation

The depicted apparatus 100 can be used in four preferred modes:

1. Step mode: the entire pattern on pattern generator 104 is projected in one go (i.e., a single "flash") onto a target portion 120. Object table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, pattern generator 104 is movable in a given direction (the so-called "scan direction," e.g., the y direction) with a speed v, so that patterned beam 110 is caused to scan over the array of individually controllable elements 104. Concurrently, object table 106 is simultaneously moved in the same or opposite direction at a speed V=Mv, in that M is the magnification of projection system 108. In this manner, a relatively large target portion 120 can be exposed, without having to compromise on resolution.

3. Pulse mode: pattern generator 104 is kept essentially stationary and the entire pattern is projected onto a target portion 120 of substrate 114 using pulsed radiation system 102. Object table 106 is moved with an essentially constant speed such that patterned beam 110 is caused to scan a line across substrate 114. The pattern on pattern generator 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until substrate 114 has been exposed line by line.

4. Continuous scan mode: essentially the same as pulse mode except that a substantially constant radiation system 102 is used and the pattern on pattern generator 104 is updated as patterned beam 110 scans across substrate 114 and exposes it.

Regardless of the operation mode used, the pattern generated by the SLM or MSA of pattern generator 104 (i.e., the ON or OFF state of each of the individually controllable elements—hereinafter referred to as "SLM pixels") are periodically updated to transfer the desired image to the substrate. For example, in step mode and scan mode, the pattern can be updated between each step or scan operation. In pulse mode, the SLM pattern is updated as required between pulses of the radiation system. In continuous scan mode, the SLM pattern is updated as the beam scans across the substrate.

Combinations and/or variations on the above described modes of use or entirely different modes of use can also be employed.

IV. An Example Rasterization Algorithm

A typical optical rasterization algorithm consists of several steps. First, a mask file is read by a mask reader. The mask file (e.g., a GDSII file) consists of data in a vector format, which is typically a union of polygons. Second, the mask file is used to generate a dense area bitmap of the pattern. Third, the dense area bitmap is then used to calculate a graytone area bitmap by averaging the dense area bitmap on an SLM pixel grid; this is referred to as supersampling. (Supersampling is described in more detail below with reference to FIG. 3.) Fourth, the supersampled area bitmap is then either optimized or "filtered" using, for example, a grid filter from Micronic Laser Systems AB located in Taby, Sweden. Finally, the filtered or optimized graytones are converted into a tilt, phase angle distribution, or the like, depending on the actuation mechanism of the SLM.

As mentioned above, the details of supersampling are described with reference to FIG. 3, which includes a first graphical representation 310 and a second graphical representation 320. First graphical representation 310 represents vector data of a pattern in relation to SLM pixels. In this example, the pattern is a set of parallel lines 312, each having a width of about 60 nanometers with the centers of each line being about 130 nanometers apart. A center of the pattern is located at x=0 nm. The rectangular dotted boxes represent SLM pixels, each having a width of 30 nanometers, for example, for illustrative purposes, and not limitation, three example pixels are numbered—first pixel 301, second pixel 304 and third pixel 307.

Figure 3:
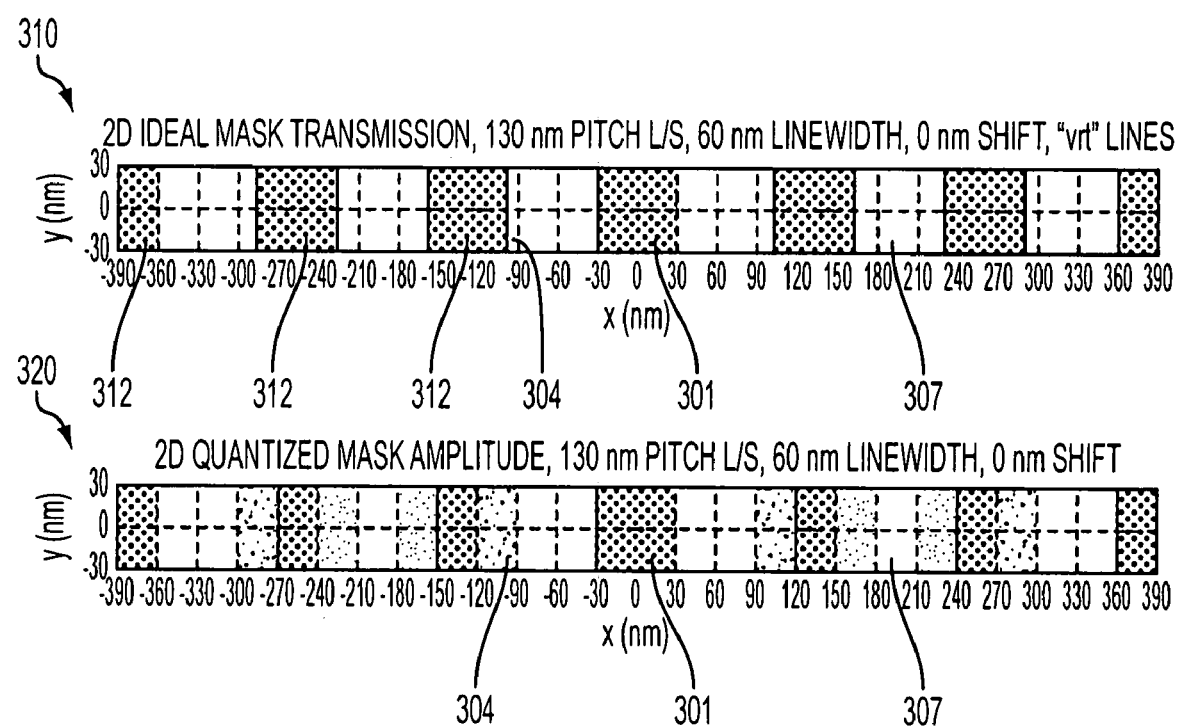
FIG. 3 is a graphical representation of two sets of supersampled graytones.

Before describing second graphical representation 320, a few general comments about FIG. 3 are in order. First, it is to be appreciated that the pattern and numbers used in FIG. 3 are for illustrative purposes only, and not limitation. In particular, as a person skilled in the relevant art will appreciate upon reading and understanding the description contained herein, an alternate pattern could be used with a corresponding set of alternate numbers. Second, it is to be appreciated that the pixel widths shown in FIG. 3 (e.g., 30 nanometers) represent pixel widths as projected on a substrate (e.g., substrate 114), not the actual width of the pixel.

Continuing with the description of FIG. 3, second graphical representation 320 represents the supersampled version of first graphical representation 310. The graytones of second graphical representation 310 are determined so as to emulate a 6% Attenuating PSM. That is, the pattern in graphical representation 310 (i.e., lines 312) is averaged over the area of each respective pixel to determine the graytone of the respective pixels. A few examples will serve to illustrate supersampling.

As a first example, consider first pixel 301 of first graphical representation 310. First pixel 301 extends from x=0 nm to x=30 nm. As can be seen from first graphical representation 310, one of the vertical lines of the pattern completely covers the area of first pixel 301. Since first pixel 301 is completely covered, the supersampled graytone is completely dark, as can be seen by looking at first pixel 301 in second graphical representation 320.

As a second example, consider second pixel 304 of first graphical representation 310. Second pixel 304 extends from x=−120 nm to x=−90 nm. As can be seen from first graphical representation 310, a line 312 only partially covers second pixel 304. Averaging the amount of line 312 that covers second pixel 304 over the entire area of second pixel 304 yields a graytone, as can be seen by looking at second pixel 304 in second graphical representation 320.

As a third example, consider third pixel 307 of first graphical representation 310. Third pixel 307 extends from x=180 nm to x=210 nm. As can be seen from first graphical representation 310, no portion of a vertical line of the pattern covers third pixel 307. Accordingly, averaging the amount of the pattern that covers third pixel 307 over the entire area of third pixel 307 yields a graytone of zero, as can be seen by looking at third pixel 307 in second graphical representation 320.

The process of calculating the supersampled graytones needs to be repeated at multiple grid positions in order to be able to printed the pattern regardless of where the pattern edges lie with respect to the grid. Said another way, if the pattern and/or grid are shifted in relation to each other, the supersampled graytones for each pixel need to be recalculated. This is a CPU-time and memory-consuming step in the rasterization process—it requires projecting the pattern onto a high density grid multiple times corresponding to a range of positions through which the pattern can be shifted with respect to the grid.

The present invention provides a method that only requires that the graytones be supersampled for two extreme grid positions, rather than at multiple grid positions. That is, if a first and second set of supersampled graytones (corresponding to a center of a pattern being located at a first and second grid position, respectively) are known, then multiple sets of supersampled graytones (corresponding to the pattern being shifted by a continuous amount between the first and second grid positions) can be interpolated from the first and second set of graytones.

The present invention provides a rasterization method that can be characterized as a linear interpolation with constraints. Embodiments of the rasterization method are described in the next subsection. In what follows, the term "linear interpolation with constraints" is used to refer to a rasterization method in accordance with the present invention.

V. Methods of Determining Graytones

In the following, the same example as described with reference to FIG. 3 (i.e., 60 nm vertical lines at 130 nm pitch in which the SLM mirrors are actuated to emulate a 6% Attenuating PSM) is used to illustrate the linear interpolation with constraints technique of the present invention.

The pixels shown in FIG. 3 are cardinally numbered in ascending order from left to right, i.e., the pixel between x=0 nm and x=30 nm is numbered pixel 1, the pixel between x=30 nm and x=60 nm is numbered pixel 2, et cetera. First, it is to be noted that since the pattern is symmetric about the line x=0, only the graytones of the pixels to one side of the line x=0 need to be calculated. The pixels to the other side of the line x=0 then follow from symmetry. Second, since there are thirteen pixels to the right of the line x=0, in the graphs that follow (FIGS. 4, 5, and 6) there is a plot for each of the thirteen pixels. Third, it is to be noted that the numbering used in this example is for illustrative purposes only, and not limitation. A person skilled in the relevant art(s) will understand from reading this disclosure that alternative numberings of the pixels can be utilized without deviating from the scope of the present invention. In addition, the numbering of the pixels from 1 to 13 does not correspond with the ordinal numbering of the pixels (i.e., first pixel 301, second pixel 304, and third pixel 307) in any way.

Figure 5:
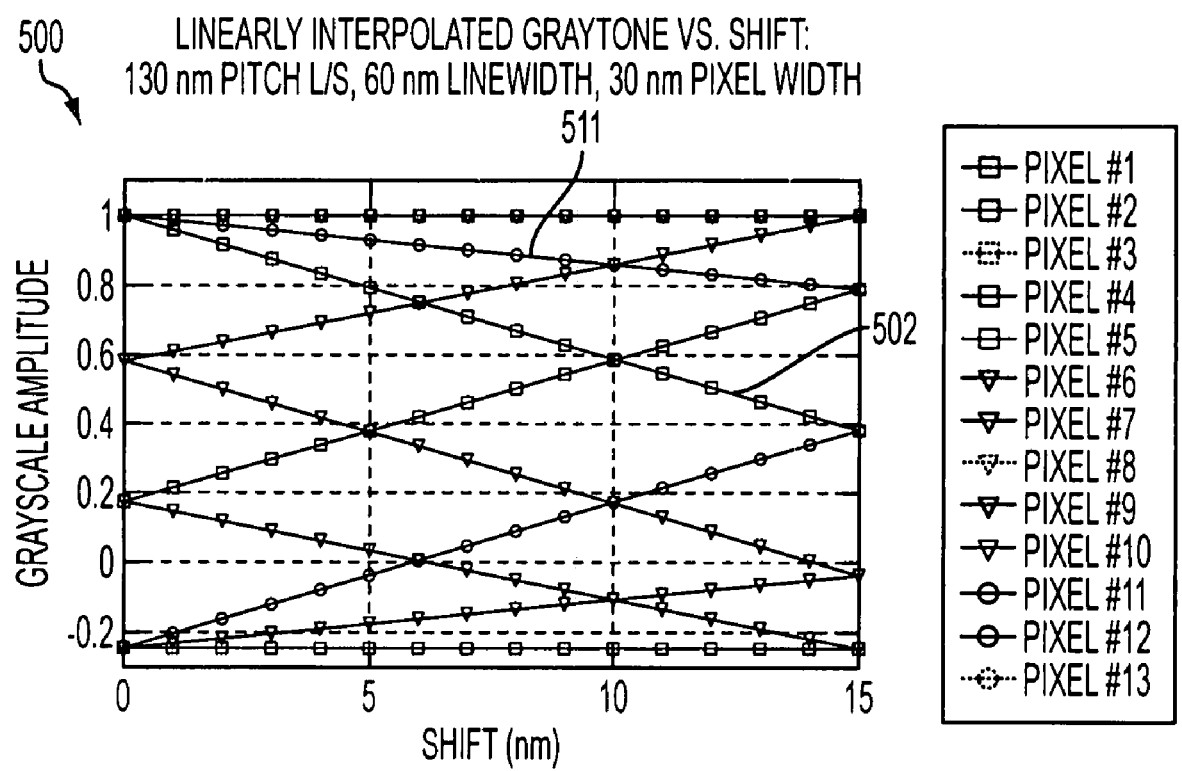
FIG. 5 is a plot of linearly interpolated graytones.
Figure 6:
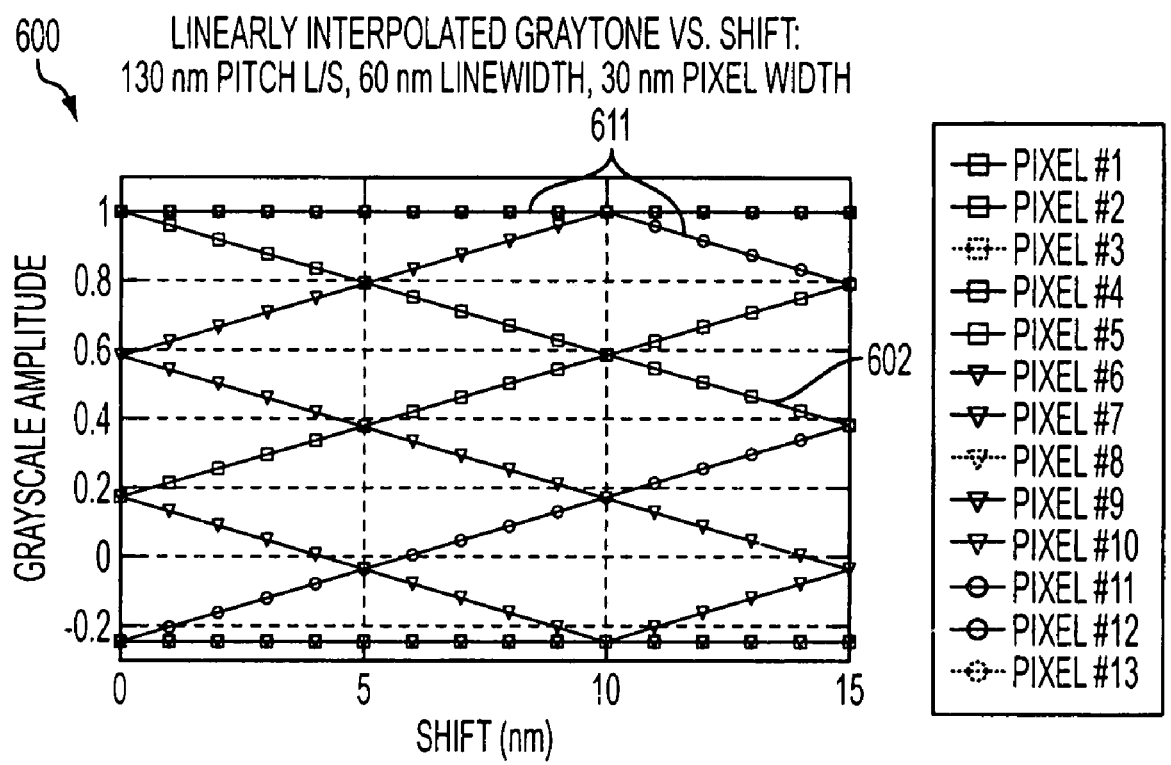
FIG. 6 is a plot of graytones that are linearly interpolated with constraints, in accordance with an embodiment of the present invention.

After the pixels are numbered, three different methods for determining the pixel graytones are presented: supersampling (FIG. 4), linear interpolation (FIG. 5), and linear interpolation with constraints (FIG. 6). The determined graytone for each pixel is plotted as a function of pattern grid position. That is, the graytones are plotted on the y-axis and the shift position (i.e., the amount that the pattern is shifted in relation to the pixels) is plotted on the x-axis. The maximum shift position is taken to be 15 nm, which is half a pixel width as projected on a target.

A. Supersampling

Figure 4:
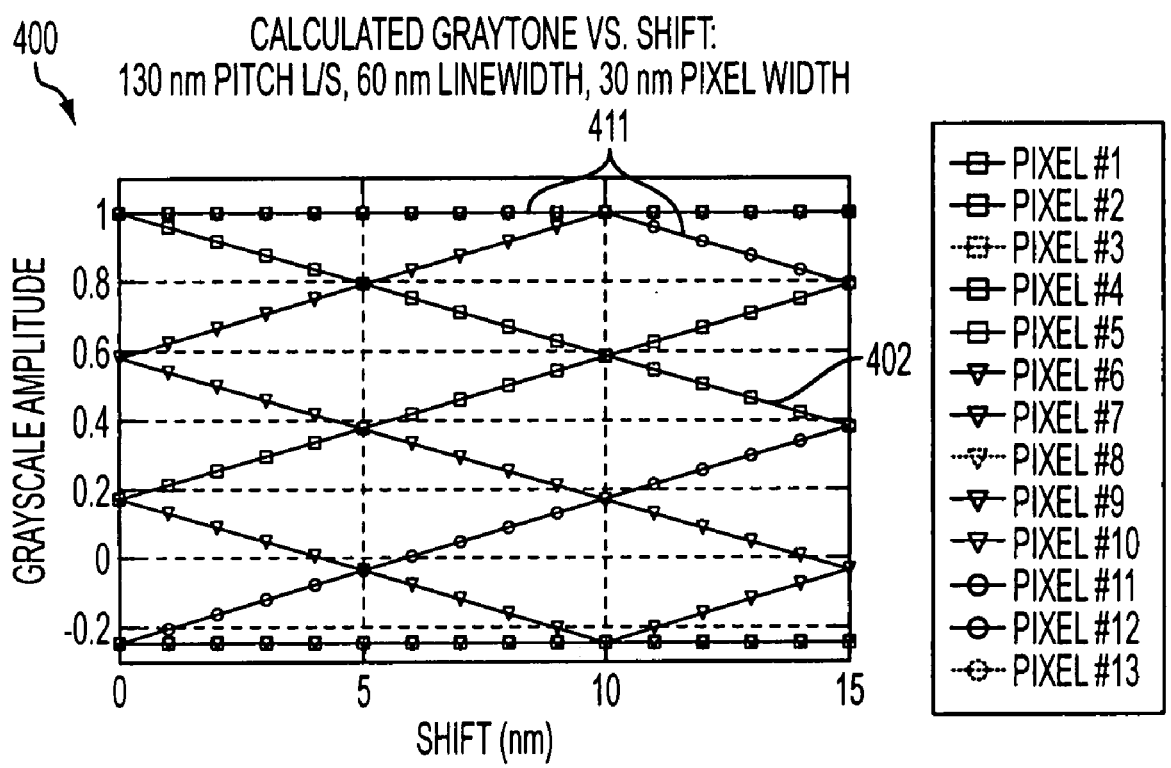
FIG. 4 is a plot of supersampled graytones.

FIG. 4 includes a plot 400 of supersampled graytones of the thirteen pixels to the right of the line x=0. The relative graytone amplitude is plotted on the y-axis and the shift (in nanometers) is plotted on the x-axis. A first curve 402 and a second curve 411 are described for illustrative purposes. First curve 402 and second curve 411 represent the supersampled graytone amplitudes of pixel 2 and pixel 11, respectively, as a function of shift position. The characteristics of each of these curves is described below.

Looking at first curve 402, it is seen that pixel 2 has a graytone amplitude of approximately 1.0 at x=0 nm and a graytone amplitude of approximately 0.4 at x=15 nm. A single straight line, with a constant slope, connects the graytone amplitude of pixel 2 at x=0 nm with the graytone amplitude at x=15 nm. That is, the graytone for pixel 2 decreases at the same rate for shift-amounts between x=0 nm and x=15 nm.

Looking now at second curve 411, it is seen that pixel 11 has a graytone amplitude of approximately 1.0 at x=0 nm and a graytone amplitude of approximately 0.8 at x=15 nm. In contrast to pixel 2, a single straight line does not connect the graytone amplitude of pixel 11 at x=0 nm with the graytone amplitude at x=15 nm. Second curve 411 has two distinct slopes; it is flat from x=0 nm to x=10 mm, then slopes down from x=10 nm to x=15 nm. The point at which the slope of second curve 411 changes (i.e., x=10 mm) is referred to herein as the "transition point." An interesting characteristic of curve 411 is that, from x=10 nm to x=15 nm, the slope of second curve 411 is the same as the slope of first curve 402; this characteristic will be discussed again below.

It is to be emphasized that FIG. 4 is generated by supersampling of the pixels at multiple grid positions. That is, the supersampled graytones for pixels 1 through 13 are determined when a center of the pattern is located at x=0 nm. The pattern is then shifted so that the center of the pattern is at x=15 nm and the supersampled graytones for pixels 1 through 13 are determined, again. Lastly, the center of the pattern is moved to a plurality of positions therein between x=0 nm and x=15 nm and at every position the supersampled graytones for pixels 1 through 13 are determined.

Supersampling the graytones at multiple positions between x=0 nm and x=15 nm requires significant memory and CPU-time. A simple method to reduce the required memory and CPU-time is to linearly interpolate the graytones between x=0 nm and x=15 nm. In this way, the supersampled graytones would only need to be computed at two extreme positions (i.e., x=0 nm and x=15 nm), not a plurality of positions (i.e., a plurality of positions between x=0 nm and x=15 nm). However, it is shown below that a simple linear interpolation does not lead to the desired graytone results.

B. Linear Interpolation

FIG. 5 includes a plot 500 of a linear interpolation of the graytones for pixels 1 through 13. That is, the supersampled graytones for pixels 1 through 13 are determined at only at x=0 nm and x=15 nm. Then, a single line is drawn for each pixel connecting the graytones at x=0 nm and x=15 nm. Plot 500 includes a third curve 502 and a fourth curve 511 representing the linearly interpolated graytone amplitudes of pixel 2 and pixel 11, respectively, as a function of shift position. These two curves are discussed to illustrate the shortcomings of a simple linear interpolation.

By comparing third curve 502 of FIG. 5 to first curve 402 of FIG. 4 it is seen that they are identical; i.e., the supersampled and linearly interpolated graytones for pixel 2 are exactly the same. However, by comparing fourth curve 511 of FIG. 5 to second curve 402 of FIG. 4 it is seen that these curves differ; i.e., linear interpolation of the graytones for pixel 11 does not yield the same results as supersampling. This shows that, while linear interpolation requires less memory and CPU-time than supersampling, it does not yield the desired results.

An aspect of the present invention provides a set of constraints, such that linearly interpolating the graytones subject to this set of constraints yields the same graytones as the supersampled graytones for each of pixels 1 through 13.

C. Linear Interpolation With Constraints

FIG. 6 includes a plot 600 of the graytones as computed by a linear interpolation subject to constraints, in accordance with an embodiment of the present invention. Plot 600 includes a fifth curve 602 and a sixth curve 611 representing the graytone amplitudes of pixel 2 and pixel 11, respectively, as a function of shift position. These curves are computed using a linear interpolation with constraints, in accordance with an embodiment of the present invention.

By comparing fifth curve 602 to first curve 402 and sixth curve 611 to second curve 411 it is seen that they are respectively identical; i.e., the supersampled graytones and the graytones computed by linear interpolation subject to constraints yield the same results for both pixel 2 and pixel 11. In fact, by comparing plot 600 to plot 400 it is seen that all of the curves are respectively identical. This shows that linear interpolation subject to constraints yields the same results as supersampling; and, since only two extreme grid position need to be supersampled (e.g., x=0 nm and x=15 nm), as compared to the plurality of grid positions in typical rasterization algorithms, linear interpolation with constraints requires less memory and CPU-time.

VI. Determining the Constraints

The constraints for linear interpolation with constraints can be determined empirically from the supersampled solutions. The extreme graytones in the final graytone distribution affect the constraints. The extreme graytones are dependent on the reticle that is to be emulated by the SLM pixels—e.g., 0s and 1s for a binary reticle, or Attenuated (Att) and 1 for an Attentuating Phase-Shift Mask (Att PSM), where Att is a maximum negative graytone amplitude. In the example shown in FIG. 6, Att is approximately −0.21.

The constraints for the specific example shown in FIG. 6 are outlined in what follows. Referring back to the example in FIG. 6, recall that it is mentioned that the slope of sixth curve 611 from x=10 nm to x=15 nm is identical to the slope of fifth curve 602. The slopes being identical is not a coincidence, it is part of a general principle: The slope of graytone versus shift is either 0 or $\alpha$. (It is to be appreciated that a can be either positive or negative.) In the example presented in FIGS. 4 and 6, $\alpha=(1-Att)/W_p$, where Wp is the width of the pixel (as projected on the substrate) and Att is the maximum negative amplitude (which in the example of FIGS. 4 and 6 is approximately −0.21).

It is to be appreciated that the specific value of $\alpha$ is shown for illustrative purposes, and not limitation. In particular, as a person skilled in the relevant art(s) will understand upon reading and understanding this description, if an example other than a 6% Att PSM were chose, the value of $\alpha$ would be different. These other values of a are contemplated within the scope of the present invention.

The constraints are defined below in terms of the specific example shown in FIGS. 4 and 6. To make contact with the example shown in FIGS. 4 and 6, the term "zero shift state" refers to the graytones of the pixels when the pattern is centered at x=0 nm and the term "final state" refers to the graytones of the pixels when the pattern is centered at x=15 nm.

As stated above, the slope of graytone versus shift position for a given pixel is either 0 or alpha. Accordingly, there are two possibilities for determining the slope of a given pixel.

According to a first possibility, the slope of each respective pixel in the set of pixels is set equal to zero, from zero shift to a transition point, and set equal to alpha, from the transition point to the maximum shift-amount, if one of the following is true: (i) the graytones of the respective pixel at x=0 nm and x=15 nm are 1 and greater than (1−Att)/2, respectively; or (ii) the graytones of the respective pixel at x=0 nm and x=15 nm are Att and less then (1−Att)/2, respectively. The transition point needs to be determined separately for each respective pixel. (The process of determining the transition point is described below.)

According to a second possibility, the slope of each respective pixel in the set of pixels is set equal to alpha, from zero shift to a transition point, and set equal to zero, from the transition point to the maximum shift-amount, if one of the following is true: (i) the graytones of the respective pixel at x=0 nm and x=15 nm are 1 and less than (1−Att)/2, respectively; (ii) the graytones of the respective pixel at x=0 nm and x=15 nm are Att and greater then (1−Att)/2, respectively; or (iii) the graytone of the respective pixel at x=0 nm is neither 1 nor Att.

The transition point for each respective pixel can be determined from the graytone at zero shift (e.g., x=0 nm) of the respective pixel, the value of alpha, and the respective pixel's graytone at maximum shift (e.g., x=15 nm). In an example, interpolator 210 (FIG. 2) determines the transition point for each respective pixel. To illustrate how the transition points can be determined, fifth curve 602 and sixth curve 611 (FIG. 6) are used to describe the determination of the transition points of pixel 2 and pixel 11, respectively. A person skilled in the relevant art(s) will be able to determine the transition point for other pixels upon reading and understanding these examples.

Referring first to pixel 2, it is noted that the graytone for pixel 2 at x=0 nm is greater than the graytone for pixel 2 at x=15 nm. In particular, the graytone at x=0 nm is 1 and the graytone at x=15 nm is approximately 0.4. Since Att≈−0.21 and (1−Att)/2≈0.60, the graytone of pixel 2 at x=15 nm is less than (1−Att)/2. All of the above conditions indicate that the slope of pixel 2 must start out as alpha, and the value of alpha must be negative, since a line with a negative slope trends downward. By examining the graytone of pixel 2 at x=0 nm, the graytone of pixel 2 at x=15 nm, and the value of alpha it follows that only a single straight line with a slope of negative alpha connects the graytone of pixel 2 at x=0 nm to the graytone of pixel 2 at x=15 nm. Hence, pixel 2 has no transition point, and the slope of pixel 2 is negative alpha from x=0 nm to x=15 nm.

Referring now to pixel 11, it is noted that the graytone for pixel 11 at x=0 nm is greater than the graytone for pixel 11 at x=15 nm. Immediately this indicates that the value of alpha must be negative, since a line with a negative slope trends downward. Since the graytones of pixel 11 at x=0 nm and x=15 nm are 1 and greater than 0.6, respectively, the constraint conditions dictate that the slope of pixel 11 must start out as zero and end as (negative) alpha. By examining the graytone of pixel 11 at x=0 nm and the graytone of pixel 11 at x=15 nm, it follows that the only way that the slope of pixel 11 is first zero and then negative alpha is if the transition point is at x=10 nm.

Generalizing to the other pixels, it logically follows that the transition point for each respective pixel is determined from its graytone at zero shift, the value of alpha, and the respective pixel's graytone at maximum shift.

The rasterization method of using linear interpolation with constraints is summarized in the next subsection.

VII. An Exemplary Rasterization Method

Figure 7:
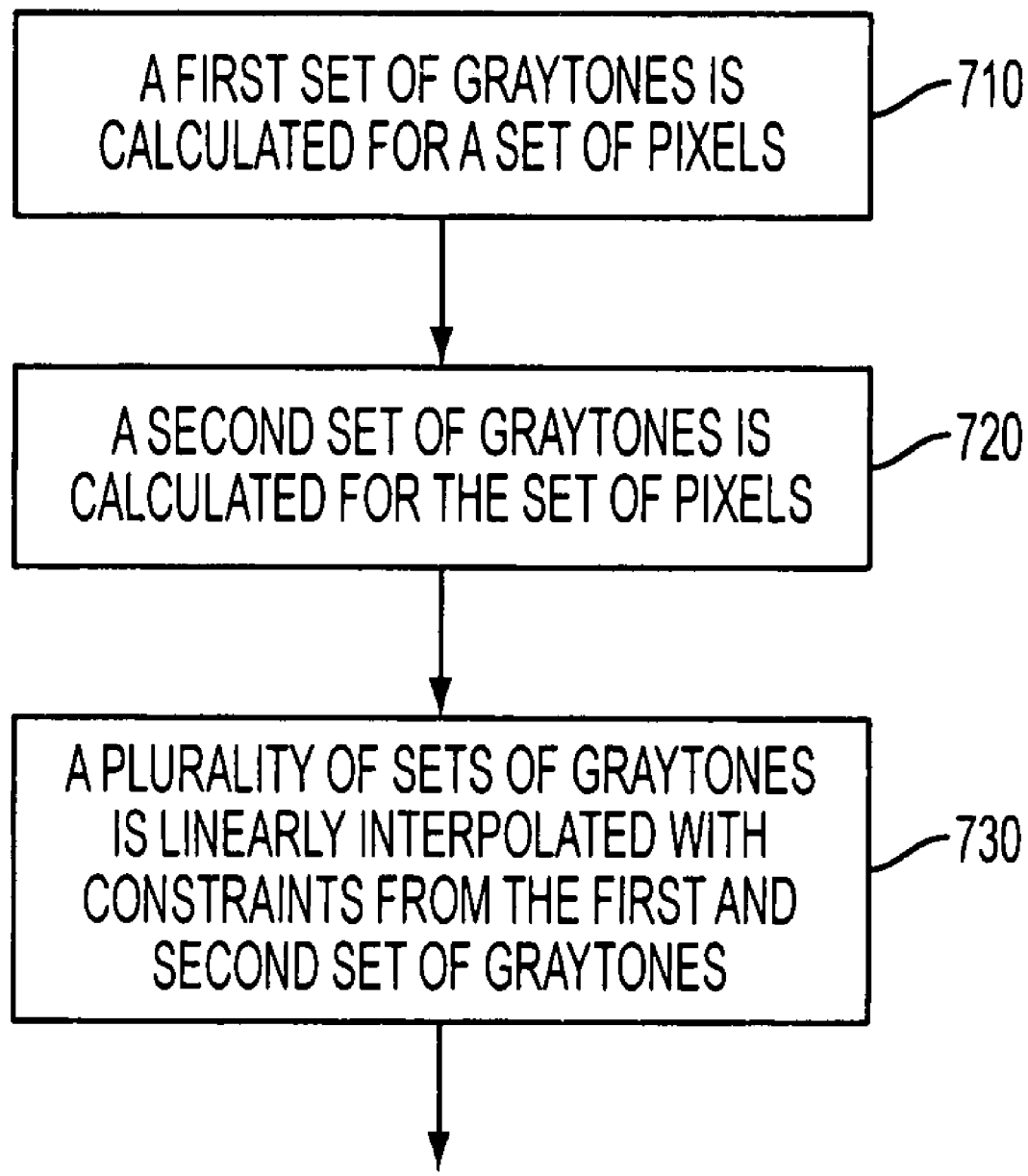
FIG. 7 is a flowchart illustrating a rasterization method, in accordance with an embodiment of the present invention.

FIG. 7 illustrates a flowchart 700 of an exemplary rasterization method, in accordance with an embodiment of the present invention. The method of flowchart 700 begins at step 710, in which a first set of graytones is calculated for a set of pixels. The first set of graytones corresponds to a center of a pattern being located at a first grid position. For the example of FIG. 6, the set of pixels consists of pixels 1 through 13 (i.e., all the pixels between x=0 nm to x=390 nm), and the first set of graytones is the supersampled graytones for these pixels when a center of the pattern is at x=0 nm.

In step 720, a second set of graytones is calculated for the set of pixels. The second set of graytones corresponds to the center of the pattern being located at a second grid position. Referring again to the example of FIG. 6, the set of pixels consists of pixels 1 through 13 (i.e., all the pixels between x=0 nm and x=390 nm), and the second set of graytones is the supersampled graytones for these pixels when the center of the pattern is at x=15 nm.

In step 730, a plurality of sets of graytones is linearly interpolated with constraints from the first and second set of graytones. The plurality of sets of graytones corresponds to the pattern being shifted by a continuous shift-amount between the first grid position and the second grid position. Referring again to the example of FIG. 6, the plurality of sets of graytones corresponds with the graytones that were linearly interpolated with constraints between x=0 nm and x=15 nm.

In an example, the function of steps 710 and 720 is performed by computing device 220 and the function of step 730 is performed by interpolator 210. It is to be appreciated that computing device 220 and interpolator 210 can be a single module, or they can be separate distinct modules.

In an example, the first set of graytones, the second set of graytones, or the plurality of sets of graytones are used to generate control signals (e.g., analog or digital signals). The control signals can be generated by a converter of controller 150 (not specifically shown). The control signals are used to actuate (control) an actuation device. For example, the actuation device may be a device that actuates SLM pixels of pattern generator 104. Depending on the type of SLM pixels used in pattern generator 104 (e.g., tilting mirrors, phase-tilting mirrors, pistoning mirrors, and grating light valves) the actuation can include, but is not limited to, the control of a tilt angle, a phase angle, or a voltage.

VIII. Implementation of Method

Figure 8:
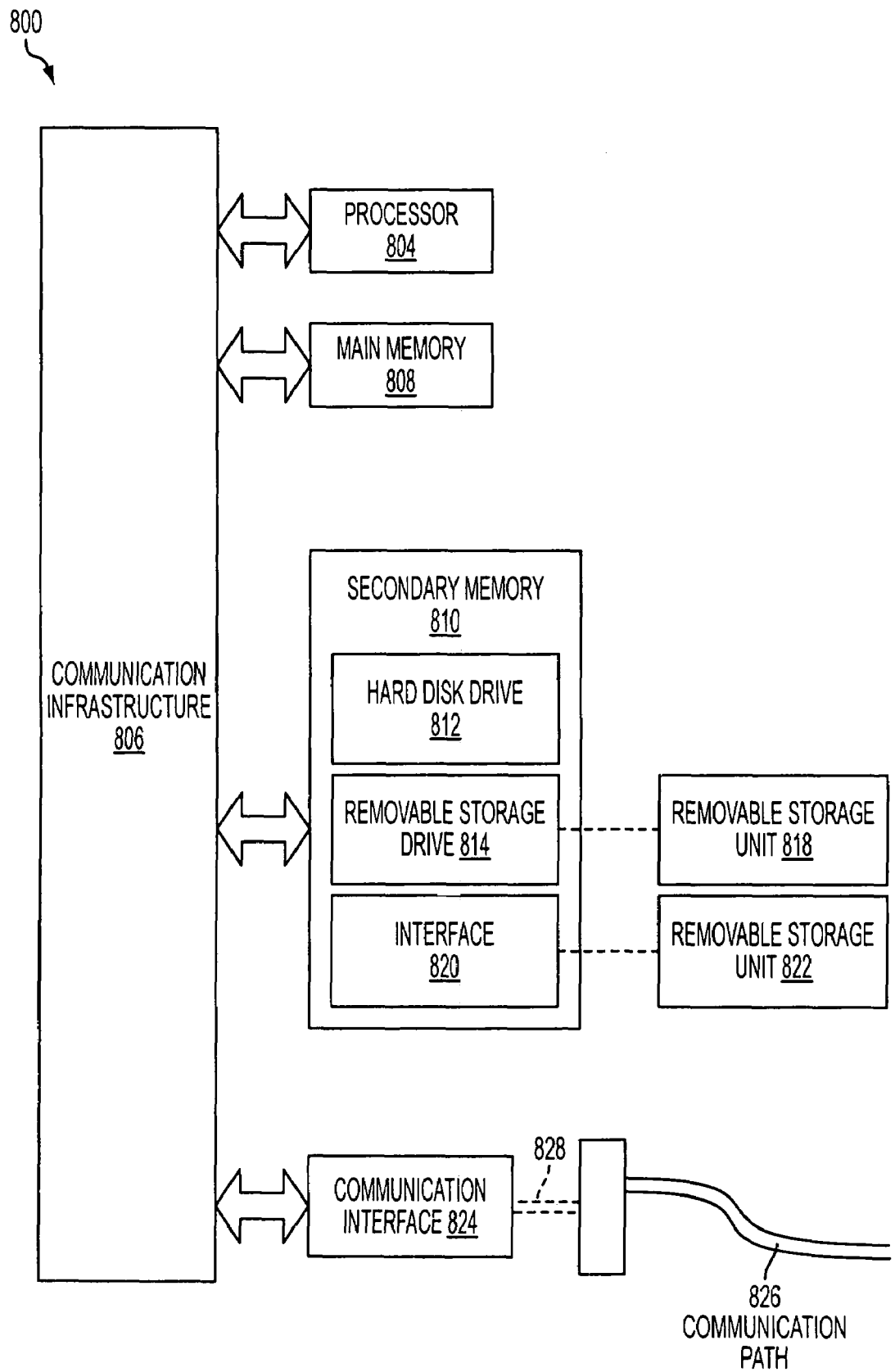
FIG. 8 is a block diagram of an exemplary computer system, in accordance with an embodiment of the present invention.

Several aspects of the present invention can be implemented by software, firmware, hardware, or a combination thereof. FIG. 8 illustrates an example computer system 800, in which the present invention, or portions thereof, can be implemented as computer-readable code. For example, one or more of the elements discussed above, for example, computing device 220 and interpolator 210 can be implemented in system 800. Various embodiments of the invention are described in terms of this example computer system 800. After reading this description, it will become apparent to a person skilled in the relevant art how to implement the invention using other computer systems and/or computer architectures.

The computer system 800 includes one or more processors, such as processor 804. Processor 804 can be a special purpose or a general purpose digital signal processor. The processor 804 is connected to a communication infrastructure 806 (for example, a bus or network). Various software implementations are described in terms of this exemplary computer system. After reading this description, it will become apparent to a person skilled in the relevant art how to implement the invention using other computer systems and/or computer architectures.

Computer system 800 also includes a main memory 808, preferably random access memory (RAM), and may also include a secondary memory 810. The secondary memory 810 may include, for example, a hard disk drive 812 and/or a removable storage drive 814, representing a floppy disk drive, a magnetic tape drive, an optical disk drive, flash memory, etc. The removable storage drive 814 reads from and/or writes to a removable storage unit 818 in a well known manner. Removable storage unit 818, represents a floppy disk, magnetic tape, optical disk, etc. which is read by and written to by removable storage drive 814. As will be appreciated, the removable storage unit 818 includes a computer usable storage medium having stored therein computer software and/or data.

In alternative implementations, secondary memory 810 may include other similar means for allowing computer programs or other instructions to be loaded into computer system 800. Such means may include, for example, a removable storage unit 822 and an interface 820. Examples of such means may include a program cartridge and cartridge interface (such as that found in video game devices), a removable memory chip (such as an EPROM, or PROM) and associated socket, and other removable storage units 822 and interfaces 820 which allow software and data to be transferred from the removable storage unit 822 to computer system 800.

Computer system 800 may also include a communications interface 824. Communications interface 824 allows software and data to be transferred between computer system 800 and external devices. Examples of communications interface 824 may include a modem, a network interface (such as an Ethernet card), a communications port, a PCMCIA slot and card, etc. Software and data transferred via communications interface 824 are in the form of signals 828 which may be electronic, electromagnetic, optical, or other signals capable of being received by communications interface 824. These signals 828 are provided to communications interface 824 via a communications path 826. Communications path 826 carries signals 828 and may be implemented using wire or cable, fiber optics, a phone line, a cellular phone link, an RF link and other communications channels.

In this document, the terms "computer program medium" and "computer usable medium" are used to generally refer to media such as removable storage drive 814, a hard disk installed in hard disk drive 812, and signals 828. Computer program medium and computer usable medium can also refer to memories, such as main memory 808 and secondary memory 810, which can be memory semiconductors (e.g. DRAMs, etc.) These computer program products are means for providing software to computer system 800.

Computer programs (also called computer control logic) are stored in main memory 808 and/or secondary memory 810. Computer programs may also be received via communications interface 824. Such computer programs, when executed, enable the computer system 800 to implement the present invention as discussed herein. In particular, the computer programs, when executed, enable the processor 804 to implement the processes of the present invention, such as operations in computing module 220 and interpolator 210 discussed above. Accordingly, such computer programs represent controlling systems of the computer system 800. Where the invention is implemented using software, the software may be stored in a computer program product and loaded into computer system 800 using removable storage drive 814, hard drive 812 or communications interface 824.

The invention is also directed to computer products comprising software stored on any computer useable medium. Such software, when executed in one or more data processing device, causes the data processing device(s) to operation as described herein. Embodiments of the invention employ any computer useable or readable medium, known now or in the future. Examples of computer useable mediums include, but are not limited to, primary storage devices (e.g., any type of random access memory), secondary storage devices (e.g., hard drives, floppy disks, CD ROMS, ZIP disks, tapes, magnetic storage devices, optical storage devices, MEMS, nanotechnological storage device, etc.), and communication mediums (e.g., wired and wireless communications networks, local area networks, wide area networks, intranets, etc.). It is to be appreciated that the embodiments described herein can be implemented using software, hardware, firmware, or combinations thereof.

IX. Conclusion

The pixel states for both the unfiltered graytone distribution (FIG. 4) and the constrained linear interpolation (FIG. 6) are numerically identical. Therefore both solutions result in identical images. The constrained interpolation is more efficient than supersampling patterns at multiple positions and it allows in-line processing.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

In addition, it is to be appreciated that the Detailed Description section, and not the Summary and Abstract sections, is intended to be used to interpret the claims. The Summary and Abstract sections may set forth one or more but not all exemplary embodiments of the present invention as contemplated by the inventor, and thus, are not intended to limit the present invention and the appended claims in any way.

What is claimed is:

1. A method, comprising:
   (a) calculating a first graytone for a pixel, the first graytone corresponding to a center of a pattern being located at a first grid position;
   (b) calculating a second graytone for the pixel, the second graytone corresponding to the center of the pattern being located at a second grid position;
   (c) linearly interpolating, with at least one constraint, a plurality of graytones for the pixel, each of the plurality of graytones corresponding to the center of the pattern being shifted by one of a plurality of shift-amounts between the first grid position and the second grid position; and
   (d) controlling an actuation state of a patterning device based on the first graytone, the second graytone, and the plurality of graytones.

2. The method of claim 1, wherein step (d) comprises:
   controlling at least one of a tilt angle, a phase angle, and a voltage of the patterning device based on the first, second, and plurality of graytones.

3. The method of claim 2, wherein the patterning device comprises
   one of a tilting mirror, a phase-tilting mirror, a pistoning mirror, and a grating light valve.

4. The method of claim 1, wherein step (c) comprises:
   (c1) determining a first subset of the plurality of graytones based on a first linear interpolation between the first grid position and a transition point; and
   (c2) determining a second subset of the plurality of graytones based on a second linear interpolation between the transition point and the second grid position.

5. The method of claim 4, wherein
a slope of the first linear interpolation and a slope of the second linear interpolation are equal to one of zero and alpha, wherein alpha is equal to (1−Att)/Wp, with Att being a maximum negative graytone amplitude and Wp being a width of the pixel.

6. The method of claim 5, wherein step (c) further comprises:
(c3) determining a location of the transition point based on the first graytone of the pixel, the second graytone of the pixel, and alpha.

7. The method of claim 5, wherein
the slope of the first linear interpolation is equal to zero and the slope of the second linear interpolation is equal to alpha, if at least one of the following is true,
(i) the first graytone is equal to one and the second graytone is greater than (1−Att)/2, and
(ii) the first graytone is equal to Att and the second graytone is less than (1−Att)/2.

8. The method of claim 5, wherein
the slope of the first linear interpolation is equal to alpha and the slope of the second linear interpolation is equal to zero, if at least one of the following is true,
(i) the first graytone is equal to one and the second graytone is less than (1−Att)/2,
(ii) the first graytone is equal to Att and the second graytone is greater than (1−Att)/2, and
(iii) the first graytone is different than one of one and Att.

9. A system, comprising:
a computing module that computes first and second graytones for a pixel, the first and second graytones corresponding to a center of a pattern being located at first and second grid positions, respectively;
an interpolator that linearly interpolates, with at least one constraint, a plurality of graytones for the pixel, each of the plurality of graytones corresponding to the center of the pattern being shifted by one of a plurality of shift-amounts between the first grid position and the second grid position; and
a converter configured to generate control signals based on the first graytone, the second graytone, and the plurality of graytones, wherein the control signals control an actuation state of a patterning device.

10. The system of claim 9, wherein the control signals control at least one of a tilt angle, a phase angle, and a voltage.

11. The system of claim 9, further comprising:
an illumination system that supplies a beam of radiation that impinges on the spatial light modulator, wherein the patterning device is configured to pattern the beam of radiation; and
a projection system that projects the patterned beam onto a target portion of an object.

12. The system of claim 11, wherein the object is one of a semiconductor wafer, a flat panel display glass substrate, or a display of a projection device.

13. The system of claim 9, wherein the interpolator determines (i) a first subset of the plurality of graytones based on a first linear interpolation between the first grid position and a transition point, and (ii) a second subset of the plurality of graytones based on a second linear interpolation between the transition point and the second grid position.

14. The system of claim 13, wherein
a slope of the first linear interpolation and a slope of the second linear interpolation are set equal to one of zero and alpha, wherein alpha is equal to (1−Att)/Wp, with Att being a maximum negative amplitude and Wp being a width of the pixel.

15. The system of claim 14, wherein the interpolator determines a location of the transition point based on the first graytone, the second graytone, and alpha.

16. The system of claim 14, wherein
the slope of the first linear interpolation is equal to zero and the slope of the second linear interpolation is equal to alpha, if at least one of the following is true,
(i) the first graytone is equal to one and the second graytone is greater than (1−Att)/2, and
(ii) the first graytone is equal to Att and the second graytone is less than (1−Att)/2.

17. The system of claim 14, wherein
the slope of the first linear interpolation is equal to alpha and the slope of the second linear interpolation is equal to zero, if at least one of the following is true,
(i) the first graytone is equal to one and the second graytone is less than (1−Att)/2,
(ii) the first graytone is equal to Att and the second graytone is greater than (1−Att)/2, and
(iii) the first graytone is different than one of one and Att.

18. The system of claim 11, wherein the patterning device comprises one of a tilting mirror, a phase-tilting mirror, a pistoning mirror, and a grating light valve.

* * * * *